United States Patent
Rasmussen et al.

(10) Patent No.: US 9,728,375 B2
(45) Date of Patent: Aug. 8, 2017

(54) MULTIPLE GAS INJECTION SYSTEM

(71) Applicant: FEI Company, Hillsboro, OR (US)

(72) Inventors: Jorgen Rasmussen, Otis Orchards, WA (US); Kevin C. Malinak, Newman Lake, WA (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 15/004,143

(22) Filed: Jan. 22, 2016

(65) Prior Publication Data

US 2016/0155607 A1 Jun. 2, 2016

Related U.S. Application Data

(63) Continuation of application No. 13/541,391, filed on Jul. 3, 2012, now Pat. No. 9,275,823.

(60) Provisional application No. 61/613,823, filed on Mar. 21, 2012.

(51) Int. Cl.
| | |
|---|---|
| *H01J 37/30* | (2006.01) |
| *H01J 37/02* | (2006.01) |
| *H01J 37/16* | (2006.01) |
| *F16K 11/07* | (2006.01) |
| *B05B 1/00* | (2006.01) |
| *B05B 1/30* | (2006.01) |

(52) U.S. Cl.
CPC .......... *H01J 37/3002* (2013.01); *B05B 1/005* (2013.01); *B05B 1/30* (2013.01); *F16K 11/0716* (2013.01); *H01J 37/02* (2013.01); *H01J 37/023* (2013.01); *H01J 37/16* (2013.01); *H01J 2237/006* (2013.01); *H01J 2237/317* (2013.01)

(58) Field of Classification Search
None
See application file for complete search history.

(56) References Cited

U.S. PATENT DOCUMENTS

| | | | |
|---|---|---|---|
| 4,418,924 | A | 12/1983 | Mack |
| 4,665,296 | A | 5/1987 | Iwata et al. |
| 4,670,685 | A | 6/1987 | Clark, Jr. et al. |
| 5,148,024 | A | 9/1992 | Watanabe |
| 5,230,741 | A | 7/1993 | van de Ven et al. |
| 5,435,850 | A | 7/1995 | Rasmussen |
| 5,591,970 | A | 1/1997 | Komano et al. |
| 5,851,413 | A | 12/1998 | Casella et al. |

(Continued)

FOREIGN PATENT DOCUMENTS

| | | |
|---|---|---|
| FR | 2956894 | 9/2011 |
| JP | 59080777 | 5/1984 |

(Continued)

OTHER PUBLICATIONS

Stevie, F.A., et al., 'Introduction to Focused ion Beams: Focused Ion Beam Gases for Deposition and Enhanced Etch,' 2005, 20 pages.

*Primary Examiner* — Joseph Miller, Jr.
(74) *Attorney, Agent, or Firm* — Scheinberg & Associates, P.C.; John B. Kelly

(57) ABSTRACT

A multi-positional valve is used to control the destination of gas flows from multiple gas sources. In one valve position the gases flow to an isolated vacuum system where the flow rate and mixture can be adjusted prior to introduction into a sample vacuum chamber. In another valve position the pre-mixed gases flow from the isolated vacuum chamber and through a needle into the sample vacuum chamber.

15 Claims, 7 Drawing Sheets

(56) References Cited

U.S. PATENT DOCUMENTS

| | | |
|---|---|---|
| 6,414,307 B1 | 7/2002 | Gerlach et al. |
| 8,076,650 B2 | 12/2011 | Smith et al. |
| 8,253,118 B2 | 8/2012 | Zhang et al. |
| 8,405,054 B2 | 3/2013 | Smith et al. |
| 8,445,870 B2 | 5/2013 | Zhang et al. |
| 2003/0053784 A1* | 3/2003 | LaBrake ................ C03C 17/22 385/128 |
| 2004/0173759 A1 | 9/2004 | Koops et al. |
| 2005/0120805 A1 | 6/2005 | Lane et al. |
| 2006/0022136 A1 | 2/2006 | Moore |
| 2006/0183240 A1 | 8/2006 | Taniyama |
| 2009/0223451 A1 | 9/2009 | Kruger et al. |
| 2009/0230299 A1* | 9/2009 | Shichi .................... H01J 27/10 250/282 |
| 2010/0197142 A1 | 8/2010 | Randolph et al. |
| 2011/0114665 A1 | 5/2011 | Chandler et al. |
| 2012/0217152 A1 | 8/2012 | Miller |
| 2012/0280136 A1 | 11/2012 | Zhang et al. |
| 2013/0015765 A1 | 1/2013 | Graupera et al. |
| 2013/0140450 A1 | 6/2013 | Graupera et al. |

FOREIGN PATENT DOCUMENTS

| | | |
|---|---|---|
| JP | S59080777 | 5/1984 |
| JP | H03059939 | 3/1991 |
| JP | 3124463 | 12/1991 |
| JP | H04186831 | 7/1992 |
| JP | H05206033 | 8/1993 |
| JP | H05315287 | 11/1993 |
| JP | H11503574 | 3/1999 |
| JP | 2000306884 | 11/2000 |
| JP | 2003504616 | 2/2003 |
| JP | 2003303788 | 10/2003 |
| JP | 2008091651 | 4/2008 |

* cited by examiner

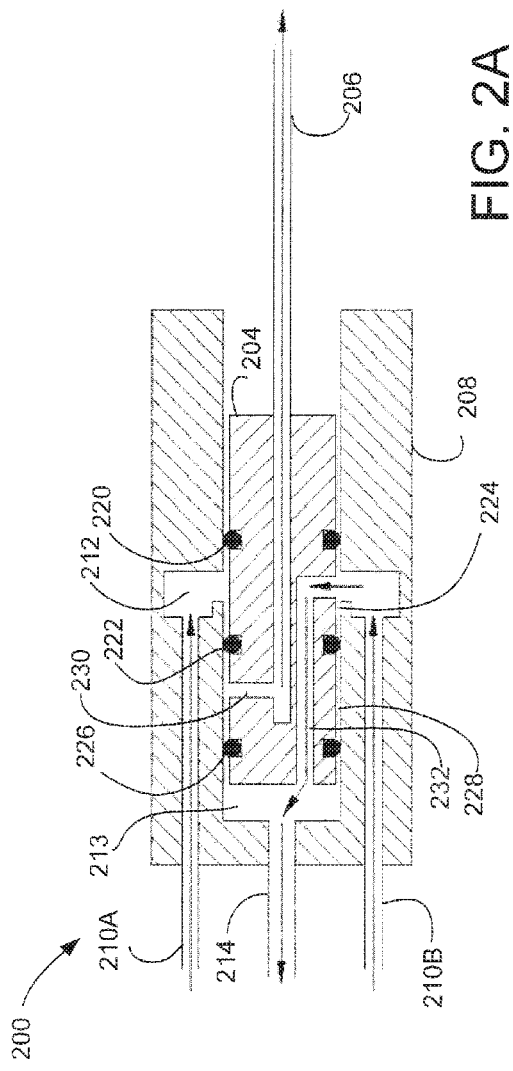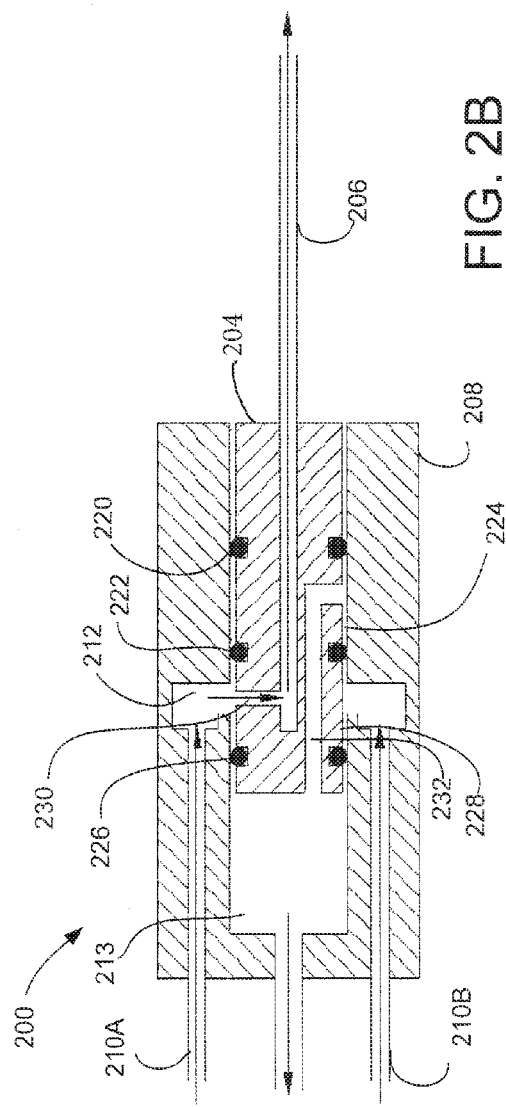

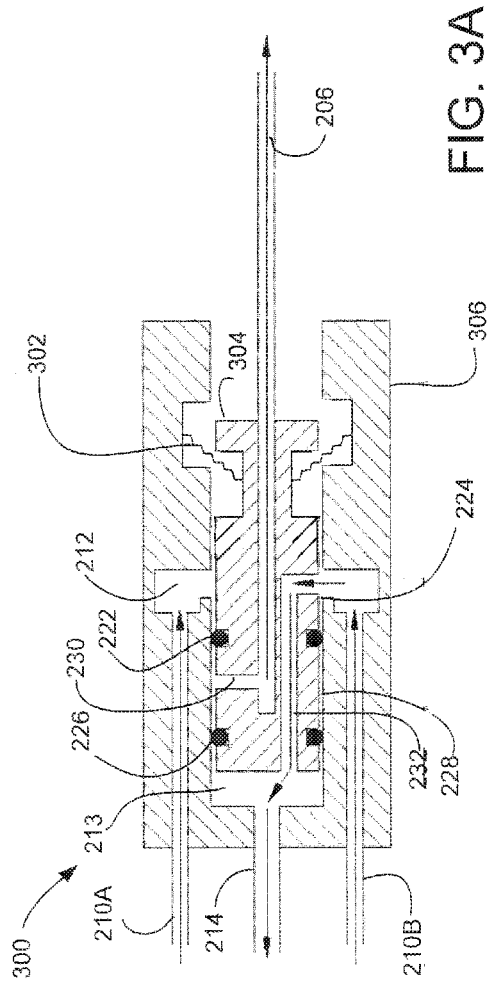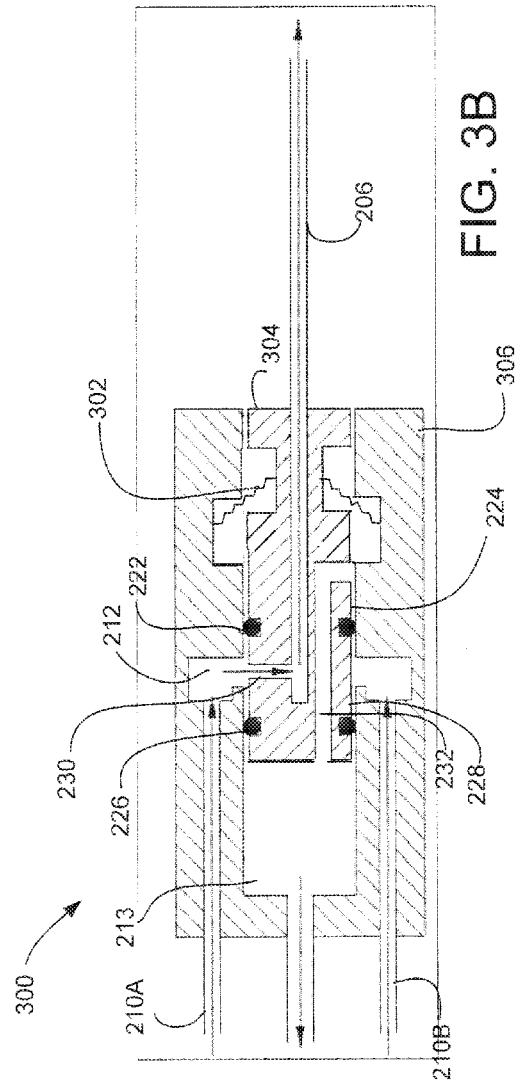

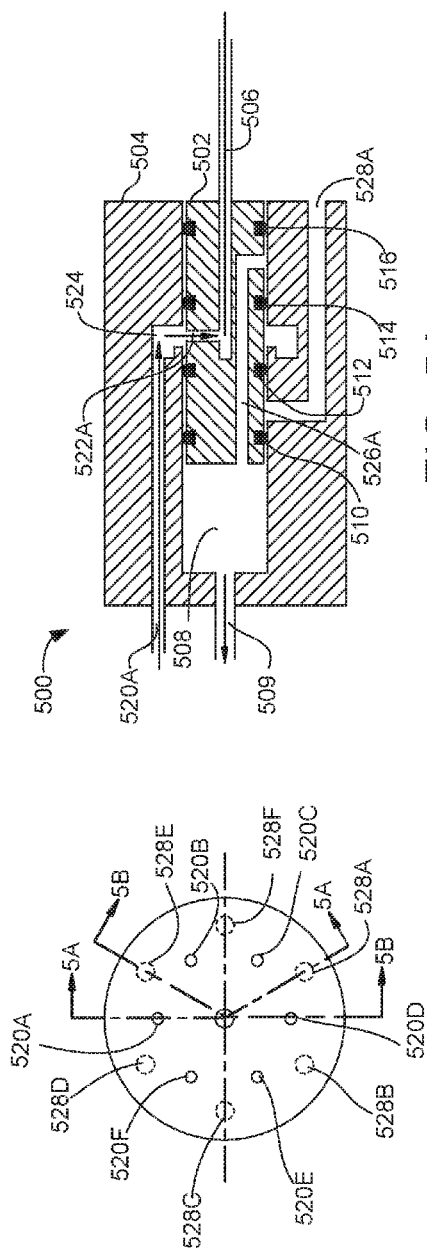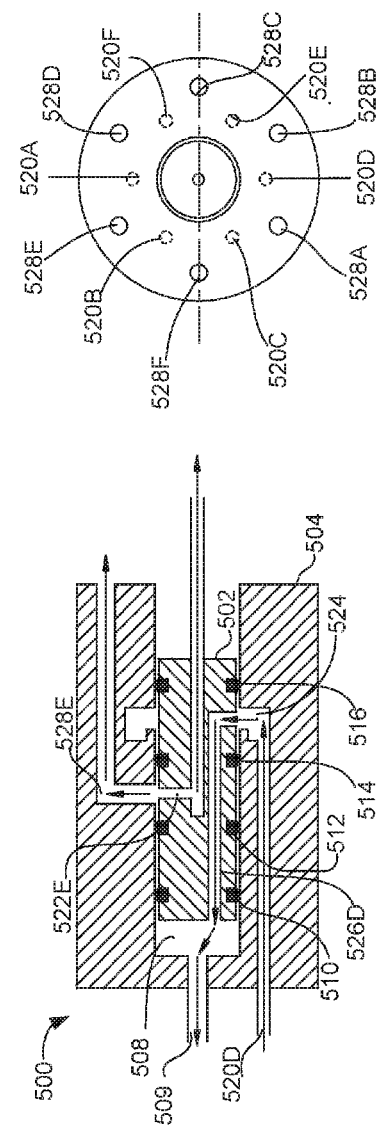

MULTIPLE GAS INJECTION SYSTEM

This Application is a Continuation of U.S. patent application Ser. No. 13/541,391, filed Jul. 3, 2012, which claims priority from U.S. Provisional App. No. 61/613,823, filed Mar. 21, 2012, which are hereby incorporated by reference.

TECHNICAL FIELD OF THE INVENTION

The present invention relates to systems for providing a gas for a beam processing system, ion beam or electron beam system.

BACKGROUND OF THE INVENTION

Beam systems, such as electron beam systems, ion beam systems, laser beam systems, cluster beam system, and neutral particle beam systems, are used to create features on a surface by etching or deposition. Beam-induced deposition processes use a precursor gas that reacts in the presence of the beam to deposit material on the surface in areas where the beam impacts. For example, a gaseous organometallic compound, such as tungsten hexacarbonyl, is provided near the sample and is adsorbed onto the surface. The organometallic compound decomposes in the presence of a charged particle beam, such as an ion beam or an electron beam, to form a metal that remains on the surface and a volatile organic compound that is removed by a vacuum pump. Etching processes use a precursor gas that reacts with the surface of the work piece to form a volatile compound. For example, iodine can be used to etch a silicon wafer. The iodine reacts in the presence of the beam to form a volatile silicon iodine compound, which leaves the sample surface and is removed by the vacuum pump.

Precursor gases are introduced into the vacuum by a "gas injection system" or "GIS." Gas injection systems typically include a gas source and a gas director, such as a needle or funnel, that is positioned near the sample and directs the gas toward the work piece. A precursor gas that is generated from a material that is solid or liquid at room temperature is typically supplied from a crucible within the vacuum chamber. The flow of gas is generated by heating the solid or liquid to increase its vapor pressure, causing gas to flow through the gas director and into the vacuum chamber. For example, tungsten hexacarbonyl is a solid at room temperature and is typically heated to about 55° C. or 60° C. to raise its vapor pressure to cause a suitable flow into a vacuum chamber.

One prior art system is described, for example in, U.S. Pat. No. 5,435,850 to Jorgen Rasmussen for a "Gas Injection System." The gas injection system of Rasmussen includes a crucible in which a solid or liquid source material is stored. The crucible is positioned within the vacuum chamber. The crucible is heated to increase the vapor pressure of the source material, and the gas from the source material then flows to the sample. The gas flow is regulated by the amount of heat supplied to the crucible and by positioning a plunger within a valve to control the size of the valve opening. The limited crucible capacity requires frequent refilling of the crucible in many applications. Such systems require realignment after each refill so that the needle is pointing toward the impact point of the charged particle beam.

Another type of gas injection system is described in U.S. Pat. No. 5,851,413 to Casella et al. for a "Gas Delivery Systems for Particle Beam Processing." In the systems of Casella, the precursor is stored outside the vacuum chamber, and flows through a conduit into a gas concentrator near the sample. Systems that store the precursor gas outside the vacuum chamber typically include a valve, such as a stepper-motor-controlled diaphragm valve, to control the gas flow.

US Pat. Pub. No. 2009/0223451 describes a system for delivering precursor gases to a beam instrument. The system uses a carrier gas to dilute and carry the precursor gases from one or more crucibles though a single main line to a needle and into the sample vacuum chamber. Flow of the carrier gas and the gas from each crucible is controlled in part by controlling the duty cycle of a pneumatic valve. Part of each crucible and the main line are in a gas envelope that opens to the sample vacuum chamber. Use of a single main line leaves precursor gas in the main line when the crucible valve is closed, thereby requiring a purging procedure for the main line, which takes time and wastes precursor gas.

U.S. Pat. Pub. No. 2011/0114665 A1 by Chandler et al. for a "Gas Delivery for Beam Processing Systems" addresses the issue of managing the sample chamber pressure, which was a limitation of the proceeding inventions. In Chandler's delivery system the gas flow from multiple gas sources is controlled by a cycling valve controlling the flow from each gas source, with the gas pressure in the sample chamber being determined by the relative time that the valve is opened and the upstream pressure at the valve. A gas valve positioned inside the vacuum chamber allows rapid response in shutting off a gas. This method of gas flow regulation is known as pulse width modulation (PWM).

All these systems take time to establish the correct flow through the needle and into the sample chamber. While the gas flow is being adjusted, the sample and other component in the vacuum chamber are being exposed to an incorrect flow of incoming gas. Moreover, because gas molecules tend to stick to the surfaces inside the gas injection system, it takes some time after a new gas is introduced before the previously used gas is no longer present in the flow.

As the demands of gas-assisted beam processing increase and processes are required to produce ever finer structures, applicants have found that this lack of control can adversely affect the processing results. Controlling the gas flow is particularly important in sensitive processes that use multiple gases, such as the process described in U.S. Pat. Pub. No. 2010/0197142 by Randolph et al for "High Selectivity, Low Damage Electron-Beam Delineation Etch."

SUMMARY OF INVENTION

An object of the invention is to improve process control in gas injection systems.

In accordance with some embodiments of the invention, gas flow rates can be adjusted, and at least some interior regions of a gas injection system can be purged, prior to the gas flowing into a sample vacuum chamber of a beam system. While the gas flow rates are being adjusted and/or while the previous gases are being purged, the gas is diverted to a flow path that does not lead to the sample vacuum chamber.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which:

FIG. 2A shows schematically an embodiment of an MGIS valve with the needle in the retracted position. FIG. 2B shows the MGIS valve of FIG. 2A with the needle in the extended position.

FIGS. 3A and 3B show schematically an MGIS valve that uses a bellows and static O-ring combination as the sealing mechanism. FIG. 3A shows the valve with the needle in the retracted position, and FIG. 3B shows the MGIS valve with the needle in the extended position.

FIGS. 5A-5D show another embodiment of an MGIS. FIGS. 5A and 5B show cross sections taken along the lines 5A-5A and 5B-5B respectively of FIG. 5C, which is a left elevation. FIG. 5A shows the valve with the needle extended for processing a work piece. FIG. 5B shows the valve with the needle in the retracted position for adjusting gas flow and purging the needle of residual gas. FIG. 5D is a right elevation.

DETAILED DESCRIPTION OF PREFERRED EMBODIMENTS

Figure 1:
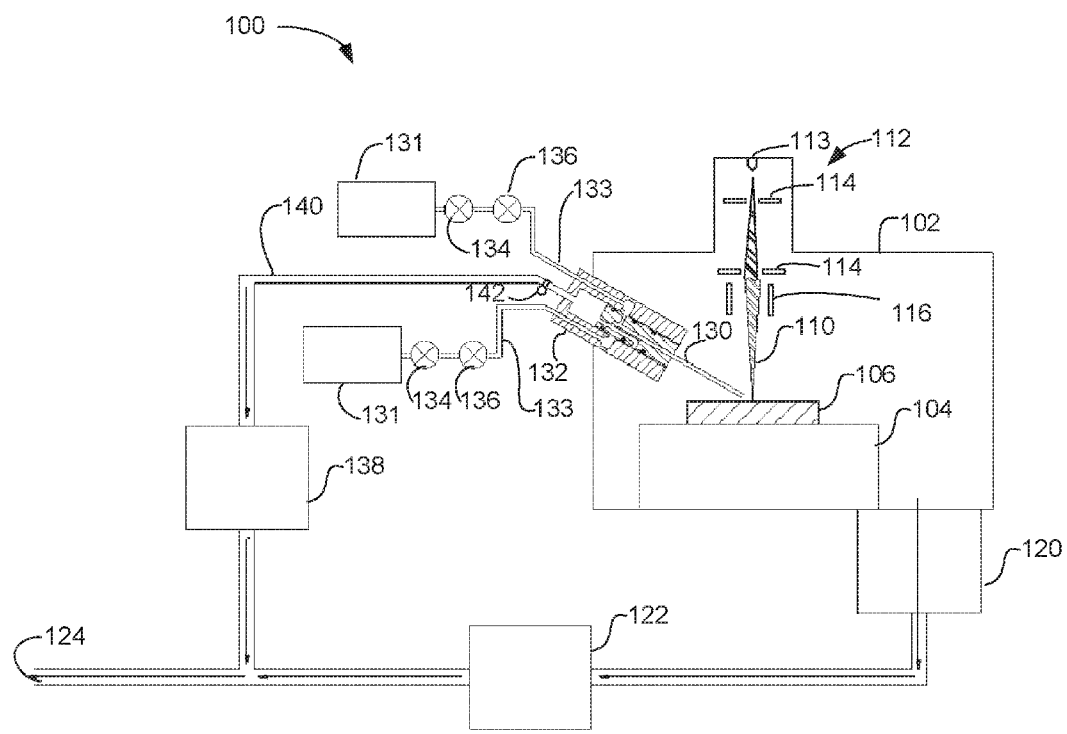
FIG. 1 shows schematically a charged particle beam system with a multigas injection system (MGIS).

In multiple gas injection systems (MGIS) operate in a two mode: a gas injection mode, in which gas is directed toward a region on the work piece surface, and in a non-injection mode, in which sample processing gases would be detrimental to work piece processing, such as imaging. In the prior art, gas did not flow in the non-injection mode. It therefore requires some time to adjust the gas flow after switching to injection mode and beginning the flow of gas. In embodiments of the invention, the gas flows in the non-injection mode, but not into the sample vacuum chamber, so flow rates can be adjusted before switching to injection mode. This is particularly useful when multiple gases are being used simultaneously to process the work piece. Embodiments allow the flow rate of each of multiple gases to be established before any gas flows into the sample chamber, so that when gas flows into the chamber, the ratio of gasses is correct.

In some embodiments, incoming gases from one or more gas sources are conducted to a mixing chamber. The valve configuration determines the path through which the gas exits the mixing chamber. In one valve configuration, the gases from the mixing chamber flow into an evacuation manifold and are evacuated from the system by a variable speed pump, allowing the flow rates to be established without gas flowing into the sample vacuum chamber. In a second valve configuration, the gases from the mixing chamber flow into the sample vacuum chamber for processing the work piece. In some embodiments, a gas injection needle can be extended toward the work piece or retracted away from the work piece. In some embodiments, extending the needle toward the work piece causes the gas to flow through the needle toward the work piece, and retracting the needle causes the gas to stop flowing through the needle and to flow instead the exhaust manifold. That is, the position of the needle controls the destination of the gas. In other embodiments, the destination of the gas and the needle position of the needle are controlled independently.

In some embodiments, the valve includes a sliding portion within a fixed portion and the position of the sliding portion determined the destination of gases flowing into the valve. O-rings or bellows divide the space between the sliding portion and the fixed portion into different gas-tight regions to ensure that gases follow the intended path and do not leak into other paths. The o-rings may be positioned in grooves in the sliding portion or in grooves in the fixed portion. The o-rings can be stationary in grooves having widths comparable to the diameter of the o-rings so that the o-rings are prevented from moving or the o-rings can be wider grooves that allow the o-rings to roll or slide with the relative motions of the fixed and sliding portions.

Proper flow rates for several process gases can be established and maintained while the gases are flowing into the evacuation chamber, and then the valve is reconfigured so that the established gas flows go through the needle. Retracting the needle when processing is complete causes any residual gas in the needle to disperse before reaching the work piece surface, thereby reducing damage from the gas.

FIG. 1 shows a schematic of a beam system 100 incorporating an embodiment of the invention. Beam system 100 includes a sample vacuum chamber 102 containing a sample stage 104 for supporting a work piece 106 to be processed by a beam 110, which is produced by a beam producing subsystem, such as a laser or a charged particle beam column. For example, a charged particle beam column 112 includes a charged particle source 113, one or more focusing lenses 114, and a deflector 116 for scanning or otherwise directing the beam 110 in a designated pattern on the work piece surface. An evacuation system, such as a combination of a high vacuum turbo pump 120 and a backing pump 122, maintains a vacuum of preferably less than $10^{-3}$ mbar more preferably less than $10^{-4}$ mbar, and even more preferably less than or equal to about $10^{-5}$ mbar in sample vacuum chamber 102 during processing. Backing pump 122 exhausts to an exhaust outlet 124.

Gas is supplied to a local area at the work piece surface by a retractable needle 130 that extends from a multiple gas injection system (MGIS) valve 132, which is described in more detail below. Gases, such as deposition precursor gases, etch precursor gases, or inert purge gases, are stored in gas reservoirs 131. The term "reservoir" is used broadly to include any gas source. Some of reservoirs 131 may include solid or liquid materials that are heated, for example, in a crucible, to evolve the desired gas, while other reservoirs 131 may include compressed gases. Each reservoir 131 is connected to MGIS valve 132 by a corresponding conduit 133, with a regulator valve 134 and a stop valve 136 in the flow path between each reservoir 131 and MGIS valve 132. While FIG. 1 shows two reservoirs with corresponding conduits, the invention is not limited to any number of reservoirs. Some embodiments of the invention use six or more reservoirs, while other embodiments may use a single gas source.

A variable speed vacuum pump 138 exhausts to outlet 124, is connected to MGIS valve 132 by a vacuum manifold 140. One suitable variable speed pump is an Edwards XDS5 scroll pump available from Edwards Ltd, West Sussex, UK. The variable speed pump preferably has built in speed control and is used to set a fixed baseline pressure in the MGIS system. A vacuum gauge 142, such as a thermocouple pressure gauge, a Pirani gauge, or a venturi gauge, measures the pressure in vacuum manifold 140, preferably near MGIS valve 132. Gas flow from one of gas sources 131 can be set to a desired value by adjusting the regulator valve 134 while observing the pressure using vacuum gauge 142.

When the MGIS needle 130 is in a retracted position, process gases from sources 131 are prevented from flowing to the needle 130 and instead pass through the evacuation manifold 140 and are evacuated by the variable speed pump 138. The supply regulator valves and other flow controls can thus be adjusted to obtain the desired flow and mixture of gases without directing the gases to the vacuum chamber while the flow is being adjusted. It is therefore possible to adjust and stabilize the process gas mixture without contaminating the sample vacuum chamber or creating a deterioration of the system vacuum in the sample vacuum chamber. Gas molecules from previously used gases have time to desorb from the wall of the interior surfaces of the valve and purge through the exhaust manifold, thereby preventing residual gases from entering the vacuum chamber and damaging the work piece.

When a pre-set gas recipe is achieved, the MGIS valve 132 needle 130 is extended and process gases flow from the valve 132 through needle 130 to the surface of work piece 106 near the point at which charged particle beam 110 is focused. Because the process gas flows have already been stabilized and the proper mix has been established in a mixing chamber within the valve while the valve was in the retracted position, the time between when the needle is inserted and the desired gas flow is directed at the work piece surface is typically less than one second.

Sample stage 104 is used to position the work piece beneath the charged particle beam 110 and the needle 130. Gases from needle 130 in the sample vacuum chamber are eventually pumped from the chamber by a turbo pump 120.

To ensure that the gas flow through the gas injection needle is the same as the flow set when the gas is flowing through the exhaust manifold, the gas conductance from the MGIS valve through gas injection needle should be about the same as the gas conductance from the MGIS valve through the exhaust manifold. Alternatively, the paths can have gas conductances that differ by a known ratio, so that one can calculate the flow rate or pressure through the needle from the flow rate or pressure through the exhaust manifold.

FIGS. 2A and 2B show an embodiment of a MGIS valve 200 in two different configurations. FIG. 2A shows the valve configured to adjust the gas flow and purge the valve. FIG. 2B shows the valve configured to deliver gas through to the work piece.

A sliding valve body 204 supports a needle 206, and the sliding valve body is supported within a support structure 208. Each one of six gas inlets, of which only gas inlets 210A and 210B are shown, provides a conduit for gas from a corresponding gas sources (FIG. 1) to a mixing chamber 212 formed in support structure 208. More than six or fewer than six gas inlets can be used, depending on the number of different gases or gas mixtures that are to be available for processing. An exhaust chamber 213 is defined between the end of sliding valve body 204 opposite the needle and support structure 208 and an exhaust outlet 214 from exhaust chamber 213 connects to exhaust manifold 140 (FIG. 1).

O-ring 220 and O-ring 222 define a front vacuum region 224 between sliding valve body 204 and support structure 208 and O-rings 222 and 226 define a back vacuum region 228, between sliding valve body 204 and support structure 208. While the O-rings are shown seated in depressions in the sliding valve body 204, the o-ring 226 and 220 could also be seated in depressions in support structure 208. Sliding valve body 204 includes a first passage 230 that leads from the back vacuum region 228 to the needle 206 and a second passage 232 that leads from the front vacuum region 224 to exhaust chamber 213.

When the sliding valve body 204 is in the retracted position as shown in FIG. 2A, process gases flow from gas inlets 210A and 210B through mixing chamber 212, second passage 232, exhaust chamber 213, and out through outlet 214 to exhaust manifold 140, where the gas is exhausted by variable speed pump 138 (FIG. 1). O-ring 220 prevents the gas from leaking into the sample vacuum chamber and O-ring 222 prevents the gas from leaking into the rear vacuum region 228 and into second passage 232 and into the sample vacuum chamber through first passage 230 and needle 206.

When the sliding valve body 204 is in the extended position as shown in FIG. 2B, gas flows from gas inlets 210A and 210B through mixing chamber 212, first passage 230 and out needle 206. O-ring 222 prevents gas from leaking into front vacuum region 224 and out through the second passage 232 to exhaust chamber 213. O-ring 226 prevents the gas from leaking into the exhaust chamber 213. An activator, for example, an electric motor, such as a stepper motor, or a pneumatic or hydraulic actuator, controls the position of the sliding valve body. The position could also be controlled manually.

FIGS. 3A and 3B show an embodiment of a valve 300 that is similar to valve 200 of FIG. 2, but o-ring 220 is replaced by a flexible barrier that is fixed to both the sliding portion and the fixed portion, such as a bellows 302. Elements that are the same as those in FIGS. 2A and 2B are identified using the same reference numbers as those used in FIGS. 2A and 2B. Bellows 302 seals better than an o-ring during the insertion and retraction motion. Bellows 302 also prevents contamination from o-rings 222 and 226 from entering the vacuum chamber. Bellows 302 is attached with an airtight seal to sliding valve body 304 and to support structure 306. Bellows 302, or any flexible barrier used, is preferably sufficiently flexible to accommodate the repetitive relative movement of the parts, is stable in the presence of the gases used, and is compatible with vacuum applications, for example, the material of the flexible barrier should not outgas or shed.

Figure 4A:
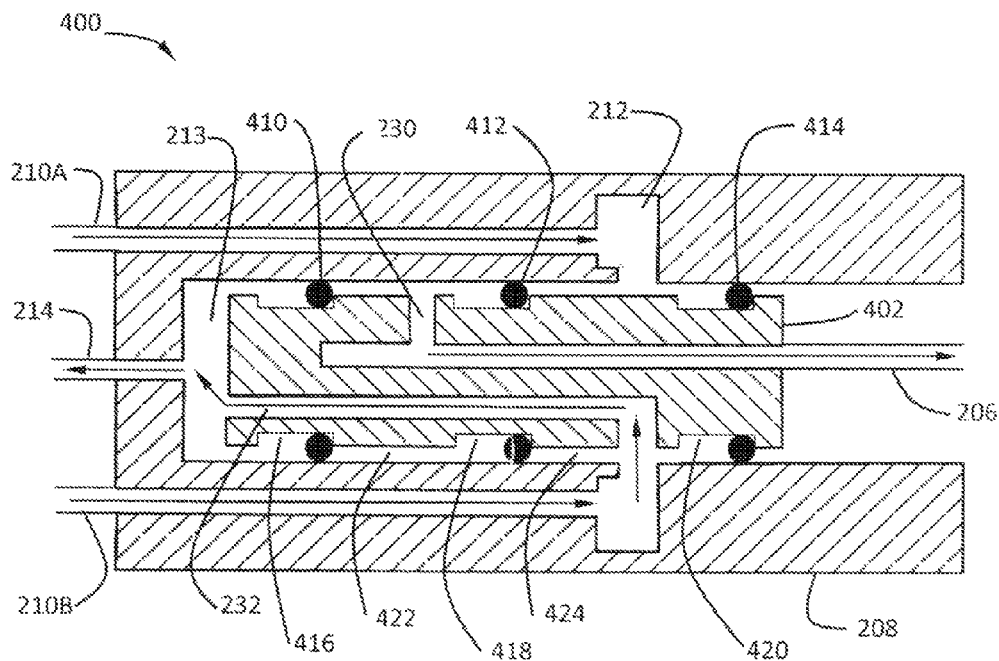
FIGS. 4A, 4B, and 4C show an MGIS that uses sliding o-rings, with FIG. 4A showing the valve with the needle in the retracted position, FIG. 4B showing the valve with the needle in the partly extended position and FIG. 4C showing the valve with the needle in the extended position.
Figure 4B:
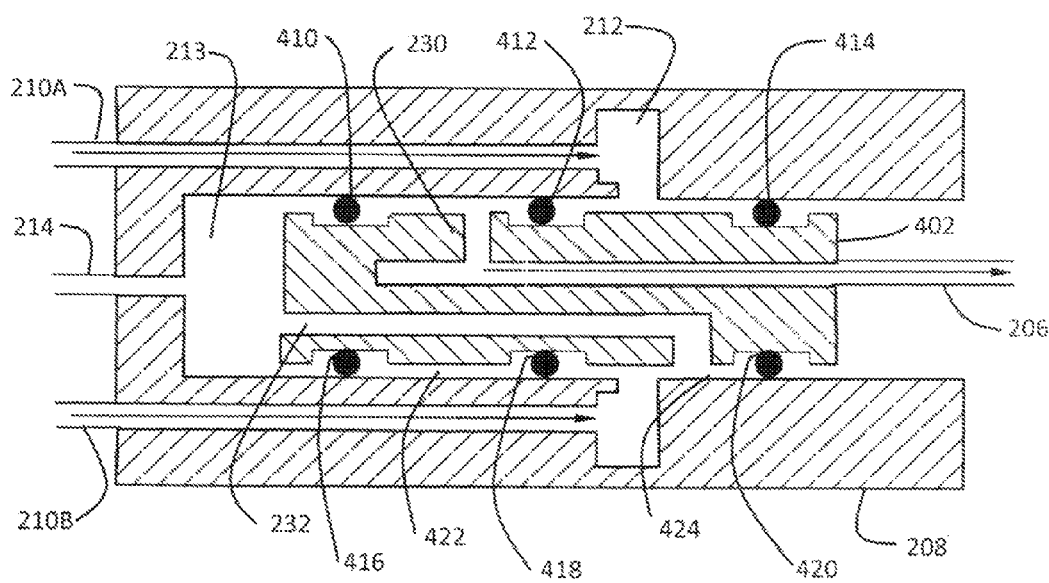
Figure 4C:
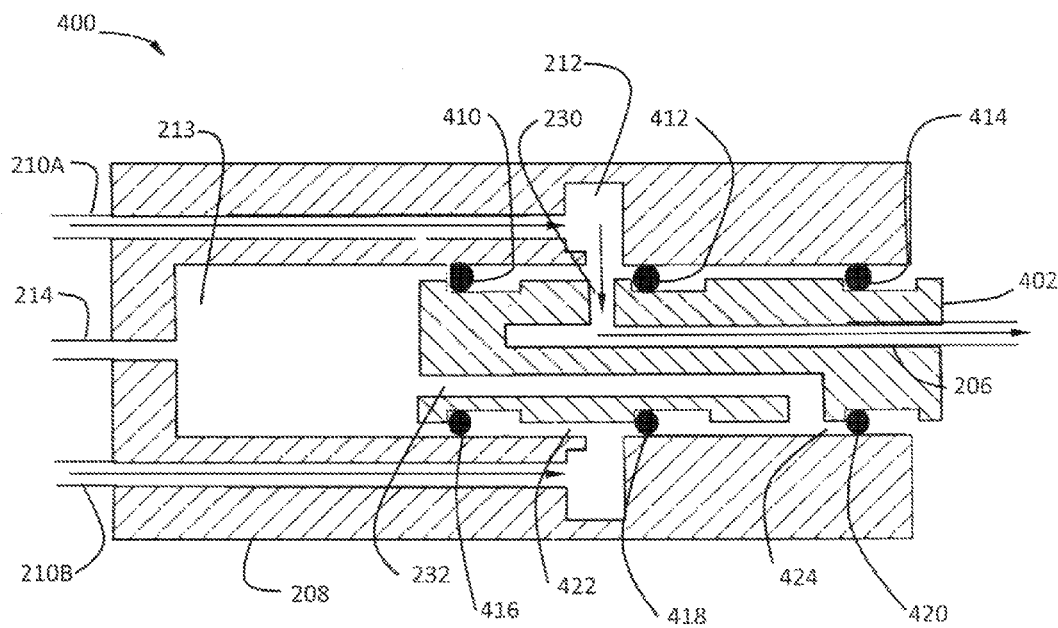

FIGS. 4A, 4B, and 4C show an MGIS valve 400 using sliding O-rings such as those described in U.S. Pat. No. 4,418,924, to Mack. Like the previously described embodiments, valve 400 includes a sliding valve body 402 that moves within a support structure 208. Valve 400 functions in essentially the same way as the previously described embodiments, but the O-rings are configured to slide or roll as the sliding valve body 402 moves relative to support structure 208 to extend or retract the needle. Using the sliding O-rings rather than static O-rings reduces the risk of particulate contamination in the sample vacuum chamber due to frictional shedding of the O-rings.

FIG. 4A shows the valve 400 configured with the needle retracted and the valve configured to set the gas flow and purge the valve, with the gas from the source flowing through the valve and out exhaust outlet 214 to evacuation manifold 140. In this embodiment, three rolling O-rings 410, 412, and 414 are each positioned in corresponding slots 416, 418, and 420 in a valve body 402 such that the o-rings create respective front and back vacuum regions 422 and 424 in the space between the valve body 402 and support structure 208. When the valve body 402 is in the retracted position as shown in FIG. 4A, the rolling O-rings 410, 412, and 414 are each located near or against the corresponding slot wall that is closest to a sample vacuum chamber. As in the previous embodiments, when the valve body 402 is in the retracted position as shown in FIG. 4A, process gases flow from gas inlets 210A and 210B, through mixing chamber 212, second passage 232, exhaust chamber 213, and out through outlet 214 to exhaust manifold 140 (FIG. 1), where the gas is exhausted by variable speed pump 138.

FIG. 4B shows how the rolling O-rings 410, 412, and 414 are positioned with the valve body 402 partly extended. When the valve body 402 is about half extended, the rolling O-rings 410, 412, and 414 have each rolled to the center of their corresponding slots. FIG. 4C shows the valve 400 with the needle fully extended and configured to deliver gas through needle 206 extended toward the work piece. When the valve body 402 is fully extended as shown in FIG. C, the rolling O-rings 410, 412, and 414 have each slid in their corresponding slot all the way to the slot wall farthest from the sample vacuum chamber. As in the previous embodiments, when the valve body 204 is in the extended position, gas flows from gas inlets 210A and 210B through mixing chamber 212, first passage 230 and out needle 206.

FIGS. 5A-5D show a MGIS valve 500. FIG. 5A shows a cross section taken along the lines 5A-5A of the left side view of FIG. 5C. FIG. 5B shows a cross section taken along the lines 5B-5B of the left side view of FIG. 5C. FIG. 5D shows a right side view of MGIS valve 500. MGIS valve 500 includes a valve body 502 that moves within a support structure 504, the valve body supporting a gas injection needle 506. MGIS valve 500 is similar to previous embodiments in that it allows the gas flow to be adjusted before gas is injected into the vicinity of the work piece. When valve 500 is in the gas flow adjustment position, gas in needle 506 is exhausted to the sample chamber.

The space between valve body 502 and support structure 504 on the end opposite of the needle 506 defines an exhaust chamber 508 having an exhaust outlet to a vacuum pump, such as variable speed vacuum pump 138 (FIG. 1). O-rings 510, 512, 514, and 516 form airtight seals between regions in the annular space between valve body 502 and support structure 504. Support structure 504 includes six gas inlet passages 520A to 520F leading to an annular gas mixing chamber 524 from at least one gas source (FIG. 1).

Six needle supply passages 522A to 522F (needle supply passage 522A shown in FIG. 5A and needle supply passage 522 E shown in FIG. 5B) extend radially from openings in the side of sliding valve body 502 between O-rings 512 and 514 to communicate with needle 506. Six bypass passages 526A to 526F in sliding valve body 502 leads from an opening in the side of sliding valve body 502 between O-rings 514 and 516 through openings in the rear of sliding valve body 502 to exhaust chamber 508. Six needle purge passages 528A to 528F lead from openings in the side of support structure 504 to in the interior of the sample vacuum chamber 102 (FIG. 1). Only one needle supply passage and one bypass passage are visible in each of FIGS. 5A and 5B. The letter designation of each individual needle supply passage 522X and each individual bypass passage 526X is determined by which passage they connect to (i.e. in FIG. 5A, needle supply passage 522A is connected to gas inlet passage 520A).

While FIGS. 5A to 5D show six gas inlet passages 520A through 520F, different embodiments can use a different number of gas inlet passages, including a single gas inlet passage in some embodiments. Similarly, any number of bypass passages could be used. The number of bypass passages does not need to match the number of gas inlet passages, because each of the bypass passages lead from the common annular mixing chamber 524, which connects to each inlet passage, to the same exhaust chamber 508. A single bypass passage could be used, but would have reduced gas conductance. Similarly, the needle supply passages connect the common mixing chamber to the needle and the needle purge passage connects the needle to the sample chamber, and so a single needle purge passage or a single needle supply passage could be used, if the single passage provides sufficient conductance.

FIG. 5A shows sliding valve body 502 with the needle 506 in the extended position for processing the work piece. Needle supply passage 522A is aligned with mixing chamber 524. In the configuration shown, gas enters inlet 520A, passes to mixing chamber 524, through needle supply passage 522A and out needle 506 toward the work piece.

FIG. 5B shows valve 500 in its fully retracted position to adjust the gas flow before injecting gas through needle 506 into the vicinity of the work piece. The bypass passage 526D is aligned with mixing chamber 524. Gas entering through gas inlet passage 520D flows into mixing chamber 524, through bypass passage 526D to exhaust chamber 508, and out exhaust outlet 509. By measuring the flow rate or pressure in an exhaust manifold (FIG. 1) connected to exhaust outlet 509, the flow rate of incoming gases can be adjusted to a desired value. Any residual gas in needle 506 from previous processing is exhausted through needle supply passage 522E and needle purge passage 528E to the sample vacuum chamber. Residual gas from needle purge passage 528E exits valve 500 away from the sample and diffuses into the sample chamber, where it is removed by the sample chamber vacuum pump.

While FIG. 5 shows the use of sliding o-rings, any of the embodiments can use rolling o-rings, sliding o-rings, or bellows in any of the positions.

Figure 6:
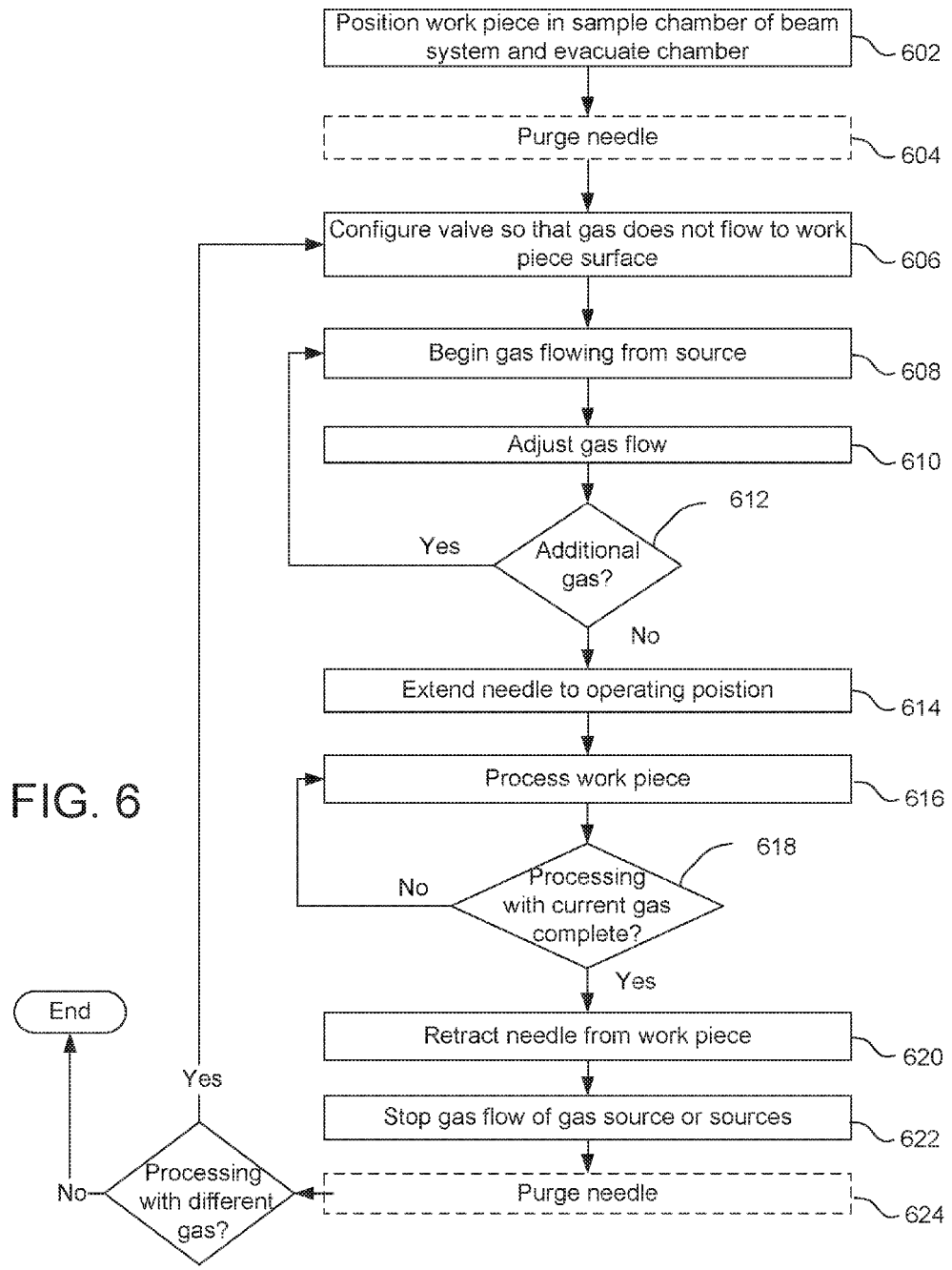
FIG. 6 is a flowchart showing a method of operation of a charged particle beam system using an MGIS valve embodying the invention.

FIG. 6 is a flow chart illustrating a method of using an embodiment of an MGIS valve. In step 602, a work piece is positioned in the sample vacuum chamber of a beam system, and the sample vacuum chamber is evacuated, for example, to a pressure lower than $10^{-5}$ mbar. At this time, the needle is not extended toward the work piece and the gas is shut off by stop valves. In optional step 604, the needle of the MGIS valve is purged to remove any residual gas adsorbed onto the interior needle surface. For example, the valve may be configured to provide a path from the needle interior to an exhaust pump.

In step 606, the valve is configured so that gas from one or more gas sources will not flow toward the work piece surface, thereby preventing gas from damaging the work piece before processing begins. In step 608, flow of a first gas is started, for example, by opening a stop valve and a regulator valve. The gas does not flow toward the work piece surface, and preferably does not flow into the sample vacuum chamber. In step 610, the gas flow is adjusted. If a solid or liquid material is used as a source of gas, the temperature of the solid or liquid is adjusted to the desired temperature. A regulator valve is adjusted to produce the desired flow rate of the gas. The regulator valve can be a needle valve or a pulse width modulation valve that controls the flow by rapidly opening and closing the valve. The flow rate is set by controlling the fraction of time that the valve is open during each cycle. The desired flow rate can be adjusted by observing the flow rate using a flow meter in the exhaust manifold or by observing the gas pressure in the exhaust manifold, which pressure correlates to the gas flow.

In decision step 612, a decision is made whether if one or more additional gases are used to provide a mixture of gases to the work piece, steps 608 and 610 are repeated for each gas. The flow rate of each additional gas can be determined by observing the total pressure or flow in the exhaust manifold, and removing the contribution to the pressure or measured flow reading from the previously measured gas or gases to provide an incremental measurement corresponding to the newly added gas.

After all the gas flows are adjusted, in step 614, the needle is extended toward the work piece and the gas flow is directed through the needle towards the work piece. In some embodiments, the MGIS valve is configured so that when the needle is extended, the gas path changes to provide gas to the work piece surface for processing. In other embodiments, extending the needle and switching to the destination of the gas flow are independent.

In step 616, the work piece is processed by the beam in the presence of the gas. When it is determined in decision block 618 that processing is complete, the needle is withdrawn from the work piece in step 620 and the flow of gas is stopped in step 622. In some embodiments, withdrawing the needle automatically routes the gas flow into an exhaust manifold, automatically stopping the flow of gases through the needle until the gas can be shut off at the shut-off valve and gas remaining in the line can be purged. While some gas remains in the needle even after the valve stops the flow of gas from the gas source, withdrawing the needle from the work piece greatly reduces the concentration of gas at the work piece as the remaining gas in the needle diffuses out. In optional step 624, gas remaining in the needle can be purged. In some embodiments, the needle in the gas is purged immediately upon completion of processing, so that any residual gas in the needle does not flow through the needle to the sample vacuum chamber.

If additional processing steps using one or more different gases are to be performed, the process is repeated from step 606. If no additional gas processing steps are to be performed, the process is ended.

Various embodiments of the invention eliminate the need to purge gases into the sample vacuum chamber while setting up a gas recipe. Embodiments provide the ability to establish the correct flow, temperatures, and other parameters before exposing the work piece to gases. A smaller volume of gas needs to be purged from the work piece surface prior to further processing or prior to process completion because only the residual gas from the needle enters the chamber after the gas flow is stopped.

While the embodiments described herein are capable of providing multiple gases, other embodiments may provide a single gas. The term "gas" is used to mean a single gas species or a mixture of gas species. To the extent that any term is not specially defined in this specification, the intent is that the term is to be given its plain and ordinary meaning. The accompanying drawings are intended to aid in understanding the present invention and, unless otherwise indicated, are not drawn to scale. Processes embodying the present invention can be performed manually or automatically. Computer instructions stored in a computer memory and interpreted by a processor or controller can be used to carry out embodiments of the invention, and such processors or memory can constitute a part of a hardware embodiment of the invention. Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of providing a first gas to a surface of a work piece in a system that uses a beam to process the work piece in the presence of the first gas, the system including a first gas source for providing the first gas, a beam source for providing the beam, and a needle for injecting the first gas from the first gas source to the work piece, the method comprising:
   causing the first gas to flow along a first path from the first gas source to a valve;
   establishing a first desired flow rate for the first gas by adjusting the flow rate of the first gas while the valve is configured to divert the first gas to a second path that does not lead to the needle;
   after the first desired flow rate is established, directing the first gas to the needle to provide the first gas to the surface of the work piece at the first desired flow rate; and
   in which directing the first gas to the needle includes extending the needle to open a gas flow path to the needle and to close a gas flow path that does not lead to the needle.

2. The method of claim 1 in which establishing the first desired flow rate includes establishing a desired flow rate of the first gas while the valve is configured to divert the first gas to a variable speed vacuum pump.

3. The method of claim 1 in which establishing the first desired flow rate includes obtaining measurements of the gas flow in the second path.

4. The method of claim 3 in which obtaining measurements of the gas flow in the second path comprises obtaining measurements of the gas flow in the second path using a measuring device in the second path.

5. The method of claim 4 in which the measuring device comprises a flow meter or a pressure measuring device.

6. The method of claim 4, in which:
   configuring a regulator valve located in the first path to adjust the flow rate of the first gas while the valve is configured to divert the first gas to the second path; and
   establishing the first desired flow rate comprises using the measurements of the gas flow obtained by the measuring device to control adjustment of the flow rate of the first gas by the regulator valve.

7. The method of claim 6 in which:
   controlling the flow rate of the first gas by rapidly opening and closing the regulator valve, in which the regulator valve comprises a needle valve or a pulse width modulation valve; and adjusting the flow rate of the first gas is carried out by controlling the fraction of time that the regulator valve is open during each open and close cycle.

8. The method of claim 1 further comprising, before directing the first gas to the needle:
causing a second gas to flow from a second gas source to the valve; and
establishing a second desired flow rate for the second gas.

9. The method of claim 1 in which establishing the second desired flow rate for the second gas includes:
measuring the flow of the first gas in the second path;
measuring the combined flow of the first gas and the second gas in the second path; and
determining the flow of the second gas by subtracting the flow of the first gas from the combined flow.

10. The method of claim 1 further comprising removing a second gas that is adsorbed onto an interior surface of the valve by establishing the first desired flow rate over a period of time sufficient to allow the second gas to desorb from the interior surface and be purged from the valve.

11. The method of claim 10 in which the second gas is a gas that was used in the system before the first gas.

12. A method of providing a first gas to a surface of a work piece in a system that uses a beam to process the work piece in the presence of the first gas, the system including a first gas source for providing the first gas, a beam source for providing the beam, and a needle for injecting the first gas from the first gas source to the work piece, the method comprising:
causing the first gas to flow along a first path from the first gas source to a valve;
establishing a first desired flow rate for the first gas by adjusting the flow rate of the first gas while the valve is configured to divert the first gas to a second path that does not lead to the needle;
after the first desired flow rate is established, directing the first gas to the needle to provide the first gas to the surface of the work piece at the first desired flow rate;
in which the system includes a sample vacuum chamber, and further comprising positioning the work piece in the sample vacuum chamber and then evacuating the sample vacuum chamber before the valve is configured to divert the first gas to the second path;
in which evacuating the sample vacuum chamber occurs while the needle is in a retracted position and while gas flow between the first gas source and the valve is shut off; and
in which configuring the needle to be in the retracted position prevents the first gas from flowing to the needle and causes the valve to be in the configuration that diverts the first gas to the second path.

13. The method of claim 12 further comprising removing residual gas that has adsorbed onto an interior surface of the needle by purging the valve.

14. The method of claim 13 wherein purging the valve is carried out subsequent to configuring the valve to provide a gas flow path from the interior of the needle to the exhaust pump.

15. The method of claim 12 in which the gas flow between the first gas source and the valve is shut off by a stop valve located in the first path.

* * * * *